United States Patent
Chen et al.

(10) Patent No.: US 11,967,516 B2
(45) Date of Patent: Apr. 23, 2024

(54) SUBSTRATE SUPPORT FOR CHUCKING OF MASK FOR DEPOSITION PROCESSES

(71) Applicant: Applied Materials, Inc., Santa Clara, CA (US)

(72) Inventors: Jrjyan Jerry Chen, Campbell, CA (US); Sanjay D. Yadav, Morgan Hill, CA (US); Tae Kyung Won, San Jose, CA (US); Jun Li, Sunnyvale, CA (US); Shouqian Shao, Fremont, CA (US); Surendra Kanimihally Setty, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 266 days.

(21) Appl. No.: 17/423,689

(22) PCT Filed: Jan. 17, 2020

(86) PCT No.: PCT/US2020/014061
§ 371 (c)(1),
(2) Date: Jul. 16, 2021

(87) PCT Pub. No.: WO2020/163060
PCT Pub. Date: Aug. 13, 2020

(65) Prior Publication Data
US 2022/0122876 A1    Apr. 21, 2022

Related U.S. Application Data

(60) Provisional application No. 62/801,605, filed on Feb. 5, 2019.

(51) Int. Cl.
*H01T 23/00* (2006.01)
*C23C 16/04* (2006.01)
(Continued)

(52) U.S. Cl.
CPC ........ *H01L 21/6833* (2013.01); *C23C 16/042* (2013.01); *C23C 16/4586* (2013.01);
(Continued)

(58) Field of Classification Search
None
See application file for complete search history.

(56) References Cited

U.S. PATENT DOCUMENTS 5,250,137 A    10/1993   Arami et al.
5,569,350 A *  10/1996   Osada ................ H01L 21/6831
                                                          118/728
(Continued)

FOREIGN PATENT DOCUMENTS

JP    H0360016 A    3/1991
JP    H0922936 A    1/1997
(Continued)

OTHER PUBLICATIONS

KR Office Action dated May 30, 2023, for Korean Patent Application No. 10-2021-7028187.
(Continued)

*Primary Examiner* — Stephen W Jackson

(57) ABSTRACT

Embodiments of the disclosure include methods and apparatus for electrostatically coupling a mask to a substrate support in a deposition chamber. In one embodiment, a substrate support is disclosed that includes a substrate receiving surface, a recessed portion disposed about a periphery of the substrate receiving surface, an electrostatic chuck disposed below the substrate receiving surface, and a plurality of compressible buttons disposed within a respective opening formed in the recessed portion that form an electrical circuit with the electrostatic chuck.

20 Claims, 9 Drawing Sheets

(51) Int. Cl.
*C23C 16/458* (2006.01)
*C23C 16/50* (2006.01)
*H01J 37/32* (2006.01)
*H01L 21/683* (2006.01)
*H01L 21/687* (2006.01)

(52) U.S. Cl.
CPC ........ *C23C 16/50* (2013.01); *H01J 37/32715* (2013.01); *H01L 21/68757* (2013.01); *H01L 21/68785* (2013.01); *H01J 2237/2007* (2013.01); *H01J 2237/3321* (2013.01)

(56) References Cited

U.S. PATENT DOCUMENTS

| | | | |
|---|---|---|---|
| 5,777,838 | A | 7/1998 | Tamagawa et al. |
| 5,822,171 | A | 10/1998 | Shamouilian et al. |
| 11,488,811 | B2* | 11/2022 | Kumar ................ C23C 16/4586 |
| 2021/0025056 | A1* | 1/2021 | Kulshreshtha ...... C23C 16/4581 |

FOREIGN PATENT DOCUMENTS

| | | |
|---|---|---|
| JP | H09102536 A | 4/1997 |
| JP | H1167885 A | 3/1999 |
| JP | 2013045989 A | 3/2013 |
| JP | 2013-084938 A | 5/2013 |
| JP | 5417428 B2 | 2/2014 |
| KR | 20150138959 A | 12/2015 |
| WO | 2010026955 A1 | 3/2010 |
| WO | 2017-209325 A1 | 12/2017 |

OTHER PUBLICATIONS

JP Office Action for Japanese Application No. 2021-544724 dated Sep. 13, 2022.
International Search Report and Written Opinion, PCT/US2020/014061, dated Jun. 4, 2020.
Korean Notice of Allowance dated Jan. 1, 2024, for Korean Patent Application No. 10-2021-7028187.

* cited by examiner

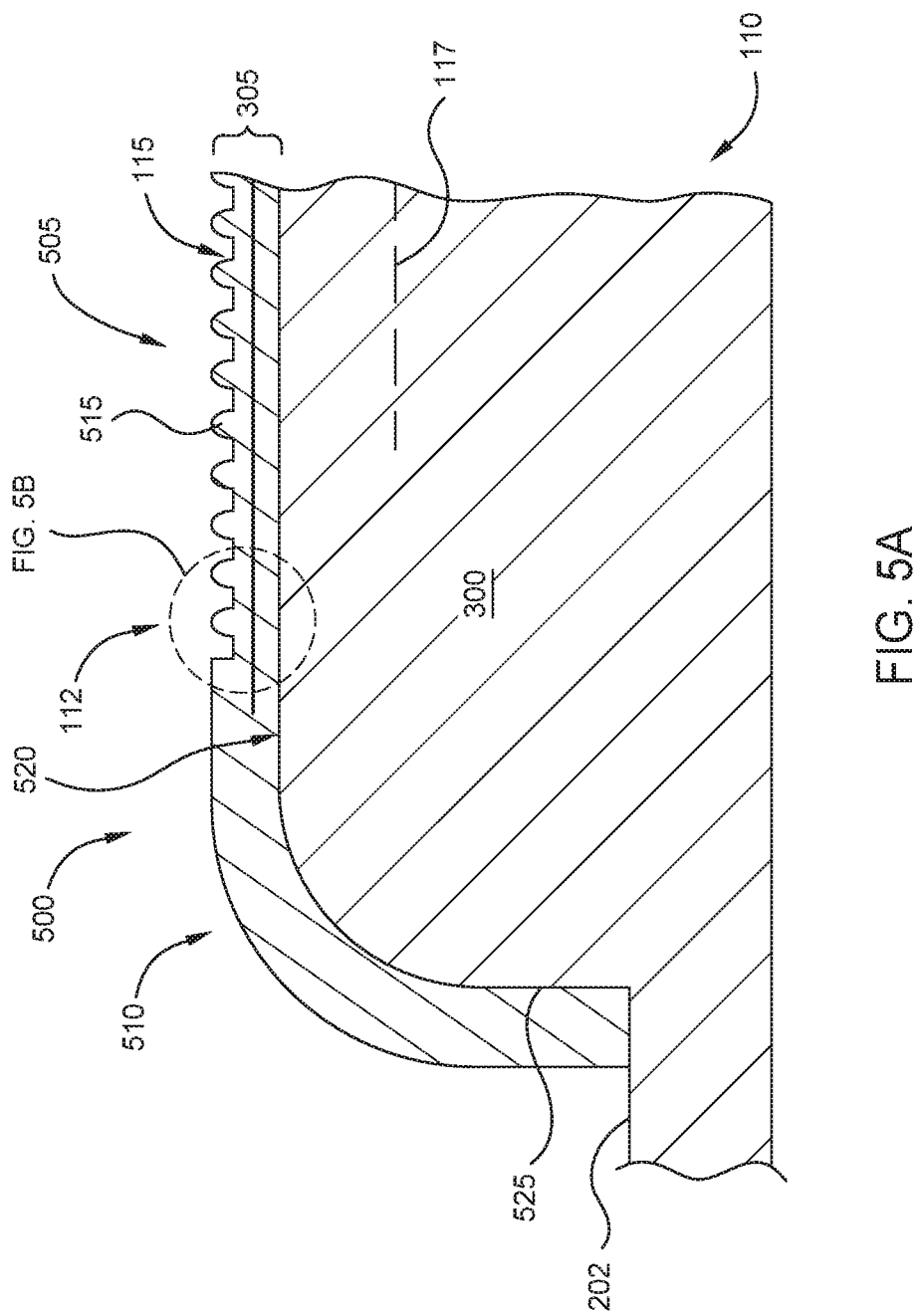

SUBSTRATE SUPPORT FOR CHUCKING OF MASK FOR DEPOSITION PROCESSES

BACKGROUND

Field

Embodiments of the disclosure relate to methods and apparatus for securing a mask utilized in a deposition process, such as a plasma enhanced chemical vapor deposition (PECVD) process or an atomic layer deposition (ALD) process used in the manufacture of electronic devices. In particular, embodiments of the disclosure relate to securing of a metallic shadow mask utilized in an encapsulation process in the manufacture of organic light emitting diode (OLED) display devices with PECVD and/or ALD processes.

Description of the Related Art

Organic light emitting diodes (OLEDs) are used in the manufacture of television screens, computer monitors, mobile phones, other hand-held devices, etc. for displaying information. A typical OLED may include layers of organic material situated between two electrodes that are all deposited on a substrate in a manner to form a matrix display panel having individually energizable pixels. The OLED is generally placed between two glass panels, and the edges of the glass panels are sealed to encapsulate the OLED therein.

There are many challenges encountered in the manufacture of such display devices. In some fabrication steps, the OLED material is encapsulated in one or more layers to prevent moisture from damaging the OLED material. During these processes, one or more masks are utilized to shield portions of the substrate that do not include the OLED material. The masks are carefully positioned relative to the substrate in order to control deposition. The masks utilized in these processes are typically metals or metal alloys having a relatively low coefficient of thermal expansion. However, during processing, the mask is typically misaligned and/or mispositioned relative to the substrate. The misalignment or mispositioning generally means the mask is not in proximity to the substrate. When the mask is misaligned and/or mispositioned as such, a shadowing effect occurs on the substrate and/or an errant coating is formed under the mask. One or both of the aforementioned issues create problems, one of them being a "mura effect" or "clouding" of portions of the final display product.

Therefore, there is a need for methods and apparatus for improved positioning of masks during the formation of OLED display devices.

SUMMARY

Embodiments of the disclosure include methods and apparatus for electrostatically coupling a mask to a substrate support in a deposition chamber. In one embodiment, a substrate support is disclosed that includes a substrate receiving surface, a recessed portion disposed about a periphery of the substrate receiving surface, an electrostatic chuck disposed below the substrate receiving surface, and a plurality of compressible buttons disposed within a respective opening formed in the recessed portion that form an electrical circuit with the electrostatic chuck.

In another embodiment, a substrate support is disclosed that includes a body comprising a conductive material, a substrate receiving surface comprising a dielectric layer adhered to the body, wherein the body includes a recessed portion disposed about a periphery of the substrate receiving surface, an electrostatic chuck disposed below the substrate receiving surface, and a plurality of compressible buttons disposed within a respective opening formed in the recessed portion that form an electrical circuit with the electrostatic chuck.

In another embodiment, a substrate support is disclosed that includes a body comprising a conductive material, a substrate receiving surface comprising a dielectric layer adhered to the body, wherein the body includes a recessed portion disposed about a periphery of the substrate receiving surface, and the substrate receiving surface comprises a groove pattern, an electrostatic chuck disposed in the dielectric layer below the substrate receiving surface, and a plurality of compressible buttons disposed within a respective opening formed in the recessed portion that form an electrical circuit with the electrostatic chuck.

BRIEF DESCRIPTION OF THE DRAWINGS

So that the manner in which the above recited features can be understood in detail, a more particular description of embodiments of the disclosure, briefly summarized above, may be had by reference to the embodiments, some of which are illustrated in the appended drawings. It is to be noted, however, that the appended drawings illustrate only typical embodiments and are therefore not to be considered limiting of its scope, for the disclosure may admit to other equally effective embodiments.

FIG. 5A is a sectional side view of a portion of a substrate support according to another implementation.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the disclosure include methods and apparatus for electrically grounding a shadow mask for use in a deposition chamber. The mask may be utilized in a plasma-enhanced chemical vapor deposition (PECVD) process chamber that is operable to align the mask with respect to a substrate, position the mask on the substrate, and deposit an encapsulation layer on an OLED material formed on the substrate. The embodiments described herein may be used with other types of process chambers and are not limited to use with PECVD process chambers. The embodiments described herein may be used with other types of deposition processes and are not limited to use for encapsulating OLED's formed on substrates. The embodiments described herein may be used with various types, shapes, and sizes of masks and substrates. Furthermore, a suitable chamber that may benefit from the masks disclosed herein is available from AKT America, Inc., Santa Clara, CA, which is a subsidiary of Applied Materials, Inc., Santa Clara, CA.

Figure 1:
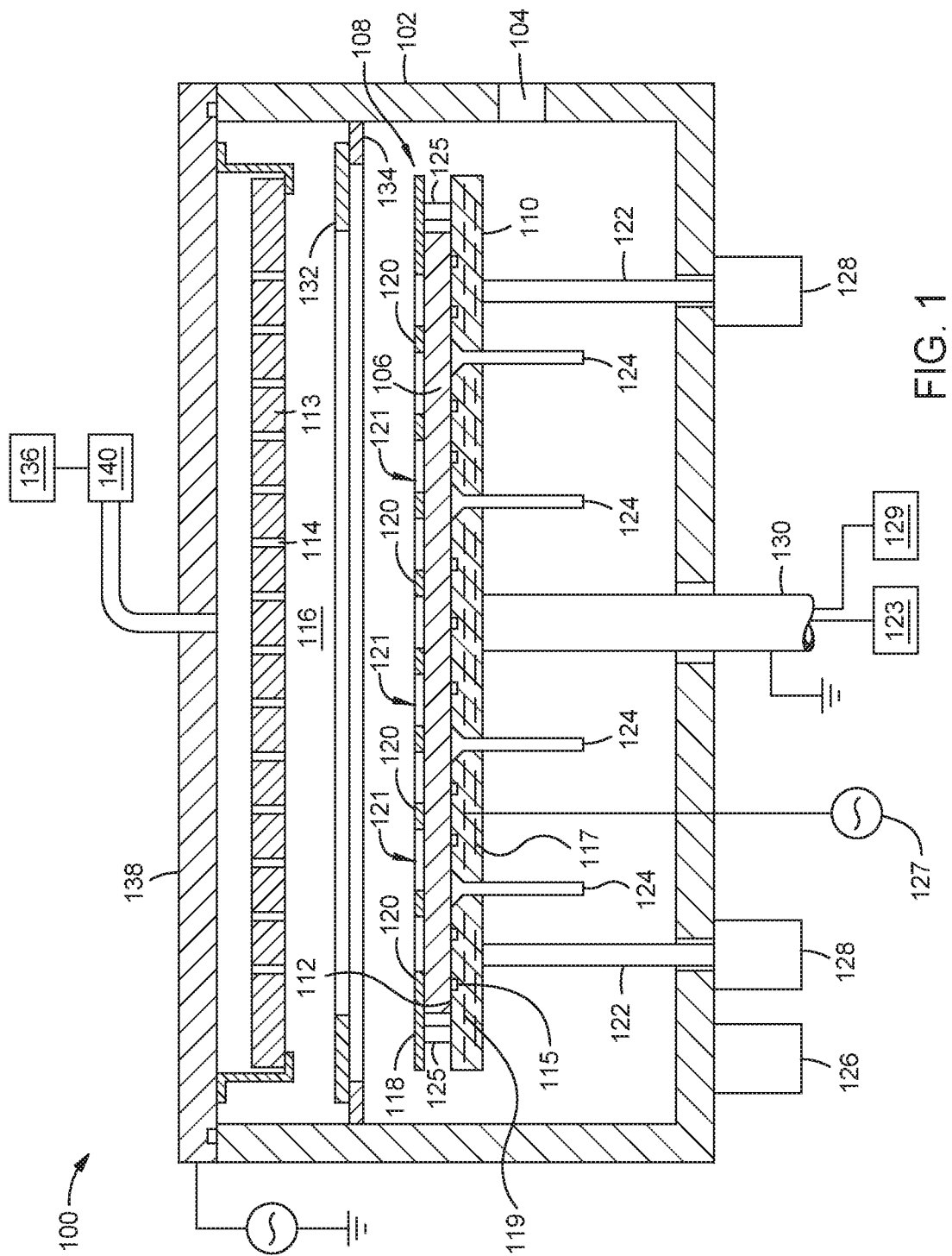
FIG. 1 is a schematic cross-sectional view of a plasma enhanced chemical vapor deposition (PECVD) chamber according to one embodiment.

FIG. 1 is a schematic cross-sectional view of a PECVD chamber 100 according to one embodiment. The PECVD chamber 100 includes a chamber body 102 having an opening 104 through one or more walls to permit one or more substrates 106 and a mask 108 to be inserted therein. The substrate 106, during processing, is disposed on a substrate support 110 opposite a diffuser 113. The substrate support 110 includes a substrate receiving surface 112 having a plurality of grooves 115 formed therein. The plurality of grooves 115 are utilized to provide a backside gas to the substrate 106 positioned thereon. The backside gas from the plurality of grooves 115 enables temperature uniformity of the substrate 106 positioned on the substrate support 110. The backside gases are provided by a gas source 129. The gases are provided to the grooves 115 by a conduit disposed in a stem 130 that supports the substrate support 110.

The diffuser 113 has one or more openings 114 formed therethrough to permit a processing gas or a processing material to enter a processing space 116 between the diffuser 113 and the substrate 106. The processing material may be a silicon containing gas, an aluminum containing gas, a polymer material, as well a carrier gases and/or reactive gases that form an encapsulation layer on OLED devices formed on the substrate 106.

The substrate 106 may be used to form an OLED display where OLED's are formed on the surface of the substrate 106 by sequential deposition processes in the PECVD chamber 100. The substrate 106 may be glass substrate, a polymer substrate, or other suitable material for forming electronic devices. The substrate 106 may be rigid or flexible. The substrate 106 may be used to form a single display or multiple displays. Each display includes a plurality of OLEDs coupled to an electrical contact layer formed about a perimeter of each display. During manufacture, the OLED portion of each display is encapsulated in one or more layers to protect the OLED's from the environment. The layers may comprise one or a combination of silicon nitride, aluminum oxide, and/or a polymer material. The encapsulation material may be deposited by a PECVD process in the PECVD chamber 100. The mask 108 is used to shield the electrical contact layer of the OLEDs during deposition of the encapsulation material. The mask 108 includes a mask frame 118 and a plurality of open areas or slots 121. Each slot 121 may be sized according the size of the OLED portion of each display. The encapsulation material is deposited on the OLED portion of each display through the slots 121. Outward of and between each slot 121 is a strip 120 that shields the electrical contact layer during the encapsulation process.

The substrate support 110 also includes a heater 117 that heats the substrate 106 positioned thereon. The substrate support 110 also includes an electrode 119. The electrode 119 is utilized to chuck the substrate 106 and/or the mask 108 to the substrate support 110. The electrode 119 is configured as an electrostatic chuck that is utilized to fix the mask 108 relative to the substrate 106. The electrode 119 is coupled to a power source 127.

One or more compressible couplers 125 may be utilized to align the mask 108 relative to the substrate support 110. The mask 108, including the mask frame 118 and the strips 120, are made of a conductive material, such as a metallic alloy material. In one embodiment, the mask 108 comprises a material having a low coefficient of thermal expansion. Examples of metallic alloys include KOVAR® alloys (Ni—Co) and INVAR® alloys (Ni—Fe). The substrate support 110 may be made of an electrically conductive material, such as aluminum. In one implementation, the compressible couplers 125 may be made of a conductive material that functions to electrically couple the mask 108 to the substrate support 110. Thus, electrons that accumulate on the substrate 106 and/or the mask 108 during PECVD processing may be transferred to ground potential through or on the mask 108, the compressible couplers 125 and the substrate support 110.

For processing, the mask 108 is initially inserted into the PECVD chamber 100 through the opening 104 and disposed upon multiple motion alignment elements 122. The substrate support 110 is disposed on the stem 130 that is coupled to an actuator 123. The elevation of the substrate support 110 in the PECVD chamber 100 may be controlled by the actuator 123. When the substrate support 110 is lowered to a level adjacent to the opening 104, the substrate 106 may be inserted though the opening 104 and disposed upon multiple lift pins 124 that extend through the substrate support 110. The substrate support 110 then raises to meet the substrate 106 so that the substrate 106 is supported on the substrate support 110. The substrate 106 may be aligned while on the substrate support 110.

Once the substrate 106 is aligned on the substrate support 110, one or more visualization systems 126 determine whether the mask 108 is properly aligned over the substrate 106. If the mask 108 is not properly aligned, one or more actuators 128 move one or more motion alignment elements 122 to adjust the location of the mask 108 relative to the substrate support 110. The one or more visualization systems 126 may then recheck the alignment of the mask 108 to verify alignment.

Once the mask 108 is properly aligned over the substrate 106, the mask 108 is lowered onto the substrate 106, and the substrate support 110 is raised until a shadow frame 132 contacts the mask 108. The shadow frame 132, prior to resting on the mask 108, is disposed in the chamber body 102 on a ledge 134 that extends from one or more interior walls of the chamber body 102. The substrate support 110 continues to rise until the substrate 106, mask 108 and shadow frame 132 are disposed in the processing position opposite the diffuser 113.

Once the mask 108 is aligned properly, the electrode 119 is energized to effectively fix the mask 108 relative to the substrate 106. Processing materials are then delivered from one or more gas sources 136 through an opening formed in a backing plate 138 while an electrical bias is provided to the diffuser 113 to form a plasma in the processing space 116 between the diffuser 113 and the substrate 106. Alternatively, a remote plasma source 140 may energize processing gas is then delivered from one or more gas sources 136 to provide a plasma to the processing space 116. Temperatures during processing may be about 80 degrees Celsius (° C.) to about 100° C., or greater.

Good contact between the mask 108 and the substrate 106 is desired in order to control deposition of the encapsulating layers and/or to prevent a "shadow" effect at the edges of the slots 121. For example, the strips 120 should lie directly on the substrate 106 to contain encapsulation material during deposition. The substrate support 110, using the electrode 119 as disclosed herein, facilitates contact between the mask 108 and the substrate 106 to prevent insufficient contact therebetween.

When there is insufficient contact between the mask 108 and the substrate 106, the encapsulation material may cover portions of the substrate 106 that are supposed to be shielded by the mask 108. However, the electrode 119 minimizes or eliminates any insufficient contact between the mask 108 and the substrate 106. The enhanced contact between the mask 108 and the substrate 106 minimizes shadowing and/or the mura effect which increases yield. The enhanced contact between the mask 108 and the substrate 106 also enables narrow or zero bezel around OLED displays on the substrate 106.

Figure 2:
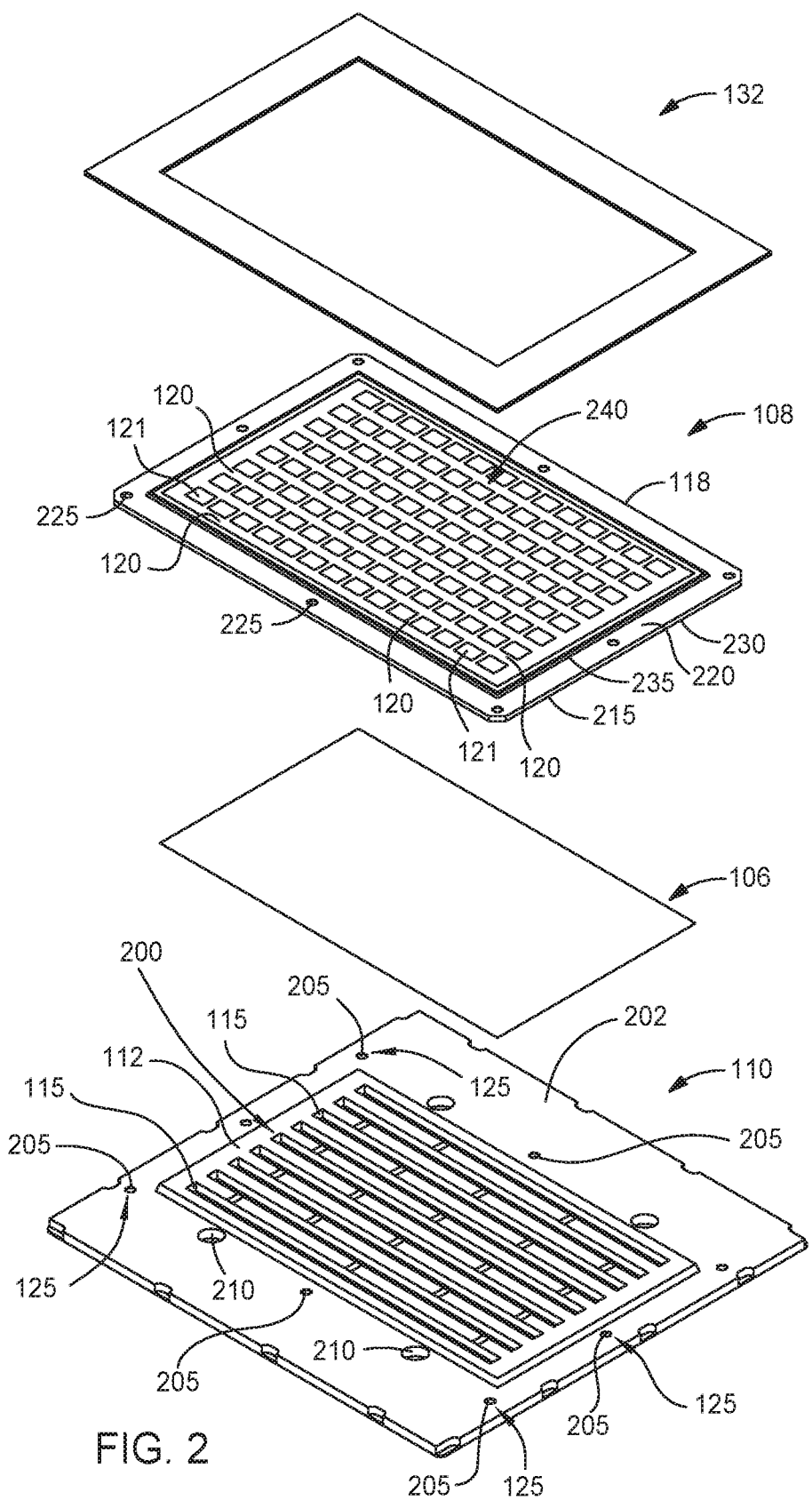
FIG. 2 is an exploded isometric view of interior chamber components used in the chamber body of the PECVD chamber of FIG. 1.

FIG. 2 is an exploded isometric view of interior chamber components used in the chamber body 102 of the PECVD chamber 100 of FIG. 1. In FIG. 2, the substrate 106 is exploded away from the substrate support 110 but rests on the substrate receiving surface 112 of the substrate support 110 during processing. The substrate support 110 is typically fabricated from an aluminum material. The substrate receiving surface 112 includes an electrostatic chuck 200 (having the electrode 119 (shown in FIG. 1) embedded therein). The electrostatic chuck 200 includes the plurality of grooves 115 for backside gas application.

A recessed surface 202 is disposed below a plane of the substrate receiving surface 112 of the substrate support 110. The recessed surface 202 includes a plurality of compressible couplers 125. In one embodiment, each of the compressible couplers 125 may be compressible buttons 205. The substrate 106 is at least partially overlaid by the mask 108 and the shadow frame 132 at least partially overlies the mask 108. The shadow frame 132 is typically fabricated from an aluminum material. The mask 108 and the shadow frame 132 may include dimensions of greater than about 0.5 meters (m) in length by 0.5 m in width. Openings 210 are shown in the substrate support 110 for access of the one or more motion alignment elements 122 (shown in FIG. 1) to extend therethrough and contact and/or move the mask 108 relative to the substrate 106 to ensure proper alignment therebetween.

The mask frame 118 also includes a first side 215 on a lower surface thereof and a second side 220 opposing the first side 215. The second side 220 may comprise a plurality of depressions 225 that mate with projections (not shown) on a lower surface of the shadow frame 132. The depressions 225 and projections (not shown) facilitate indexing and alignment of the shadow frame 132 with the mask 108. The first side 215 is joined with the second side 220 by a first outer sidewall 230. The mask frame 118 also includes a raised region 235 projecting from a plane of the second side 220. The strip 120 is coupled to an upper surface of the raised region 235. The strip 120 may be a substantially planar rectangular member that is fastened to the mask frame 118. Collectively, the strips 120 form a mask sheet 240 having the slots 121 formed therethrough. The strips 120 projects inwardly from the raised region 235 in a plane that is substantially parallel with a plane of one or both of the first side 215 and the second side 220.

Figure 3:
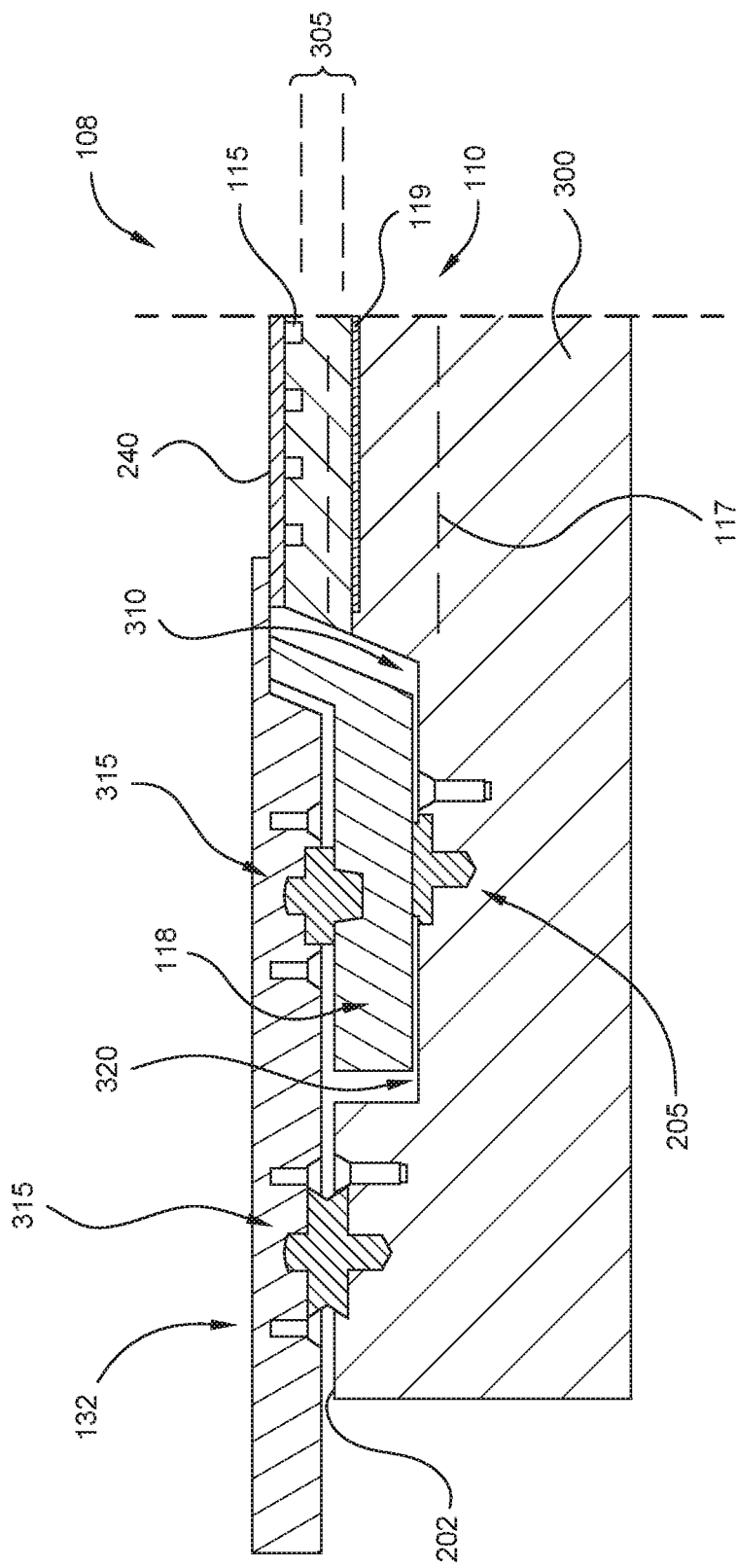
FIG. 3 is a sectional side view of one embodiment of a portion of the substrate support as disclosed herein.

FIG. 3 is a sectional side view of one embodiment of a portion of the substrate support 110 as disclosed herein. The mask sheet 240 is shown coupled to the mask frame 118, and is positioned over the substrate 106. The shadow frame 132 is shown in FIG. 3 over the recessed surface 202 of the substrate support 110, and a portion of the mask frame 118 is positioned over an edge of the substrate 106. The positions of the substrate 106, the mask 108 and the shadow frame 132 depict a processing position for an encapsulation process.

The substrate support 110 includes a body 300 made of a conductive material, such as titanium or aluminum. An electrostatic chuck 305 is disposed on an upper surface of the body 300. The electrostatic chuck 305 consists essentially of a dielectric layer (or layers) and the electrode 119 embedded therein. The plurality of grooves 115 are embossed or otherwise formed in an upper surface of the dielectric material of the electrostatic chuck 305.

The substrate support 110 also includes one of the compressible buttons 205 positioned in a pocket 310 formed in the recessed surface 202. The pocket 310 is sized to receive the mask frame 118 of the mask 108. In one implementation, the compressible buttons 205 comprise a ceramic material if the compressible buttons 205 are to have dielectric properties. In other implementations, the compressible buttons 205 are ceramic with a metallic coating or a conductive coating if a conductive property is desired. The compressible buttons 205 are biased by a spring (not shown) to provide a gap 320 between surfaces of the recessed surface 202 and the mask frame 118. The gap 320 prevents electrical continuity between the proximate surfaces of the mask frame 118 and the substrate support 110.

Additionally, the assembly shown in FIG. 3 includes a plurality of compressible rest buttons 315. One of the compressible rest buttons 315 is positioned on the recessed surface 202 of the substrate support 110 outward of the compressible button 205 and/or the pocket 310. Another of the compressible rest buttons 315 is positioned between the mask 108 and the shadow frame 132. All of the compressible rest buttons 315 comprise a dielectric material, such as ceramic materials. Although only two compressible rest buttons 315 are shown in the view of FIG. 3, a plurality of compressible rest buttons 315 are included.

Figure 4A:
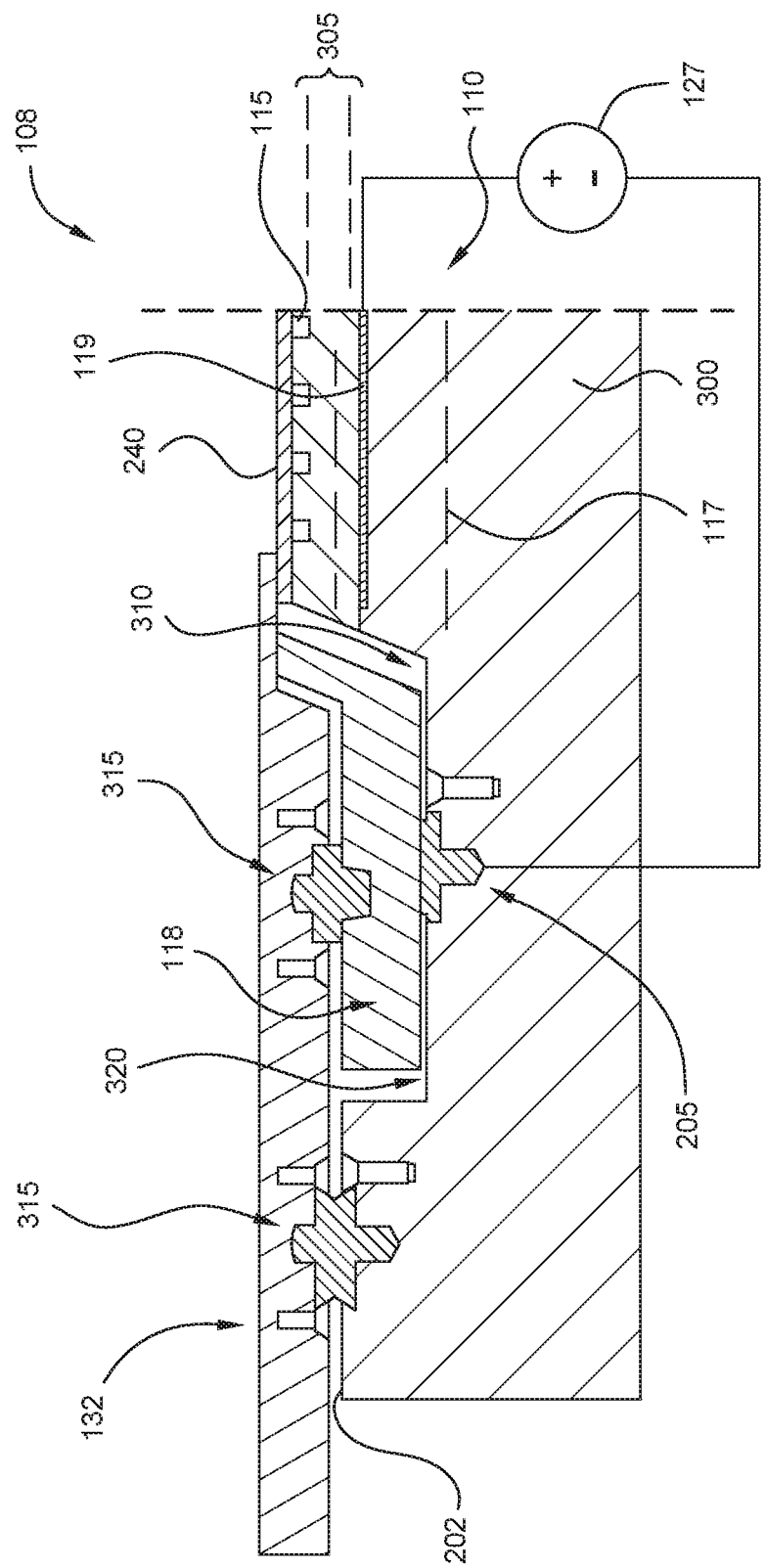
FIGS. 4A-4C are schematic sectional views of portions of the substrate support and electrostatic chuck with different electrical configurations.
Figure 4B:
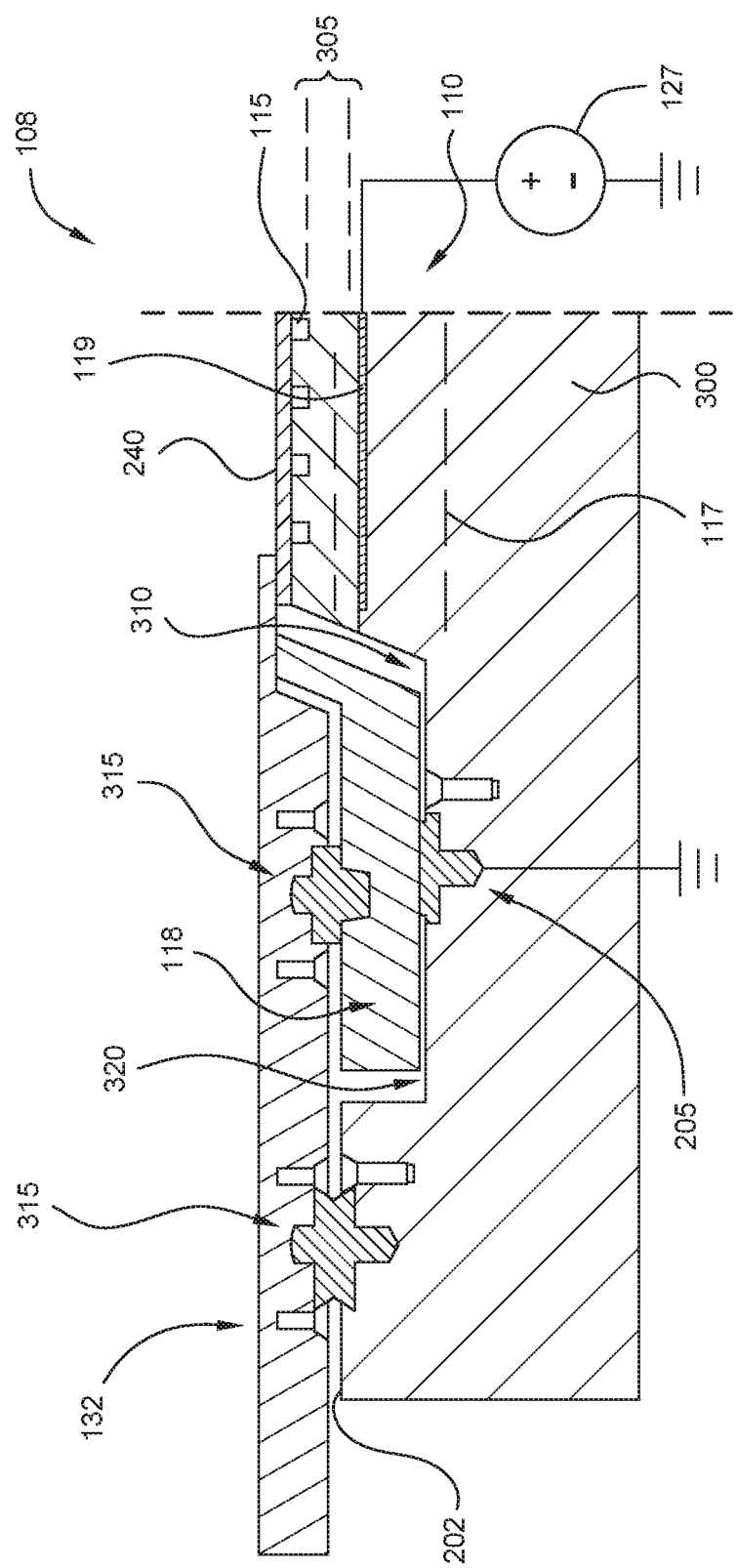
Figure 4C:
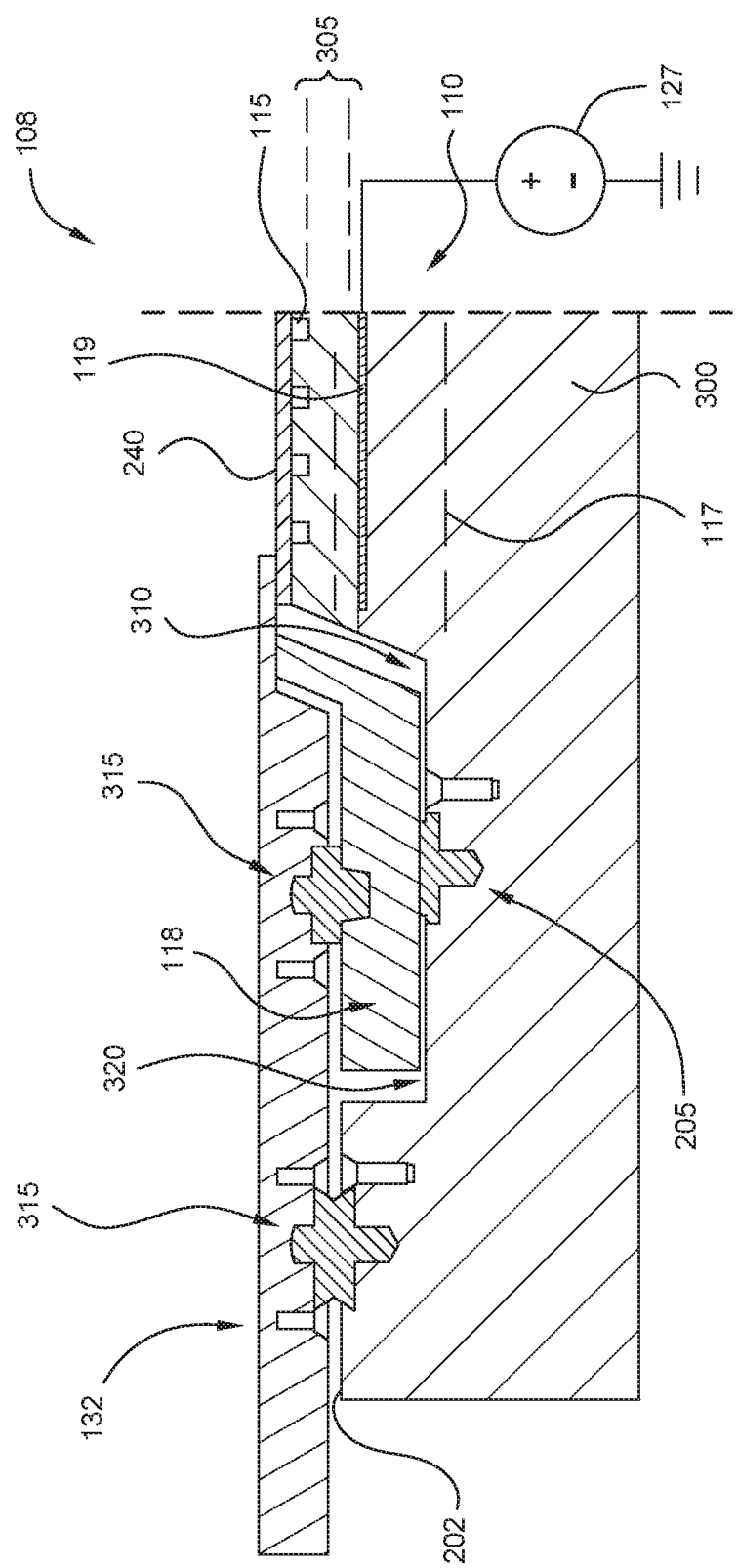

FIGS. 4A-4C are schematic sectional views of portions of the substrate support 110 as described herein. The substrate support 110 shown in FIGS. 4A-4C is similar to the substrate support 110 with the exception of different electrical circuitry for chucking the mask 108 using the electrostatic chuck 305.

In FIG. 4A, the compressible buttons 205 are electrically conductive such that a negative voltage may be applied to the mask 108 while a positive voltage is applied to the electrode 119.

In FIG. 4B, the compressible buttons 205 are electrically conductive such that a positive voltage is applied to the electrode 119 and the mask 108 is grounded.

In FIG. 4C, the compressible buttons 205 are dielectric such that the mask 108 is electrically floating while a positive voltage is applied to the electrode 119.

Testing of the substrate support 110 as shown in FIGS. 4A-4C yielded different results. While the electrode 119 is positively charged in all of FIGS. 4A-4C, the electrical potential of the mask 108 is different, which resulted in removing any mura effect. However, other criteria were considered as detailed below.

When the mask 108 is negatively charged as shown in FIG. 4A, chucking force was strong (when plasma is present or not present) as compared to other configurations but de-chucking was slow as compared to other configurations.

When the mask 108 is grounded as shown in FIG. 4B, chucking force was mild (when plasma is present or not present) as compared to other configurations but de-chucking was the fastest as compared to other configurations.

When the mask 108 is electrically floating as shown in FIG. 4C, a minimal chucking force was observed when plasma is not present. In the configuration of FIG. 4C, a chucking force when plasma is present is stronger than was observed in the configuration of FIG. 4B. In addition, in the testing of the configuration of FIG. 4C, de-chucking was faster than the configuration shown in FIG. 4A but slower than the configuration shown in FIG. 4B.

Figure 5B:
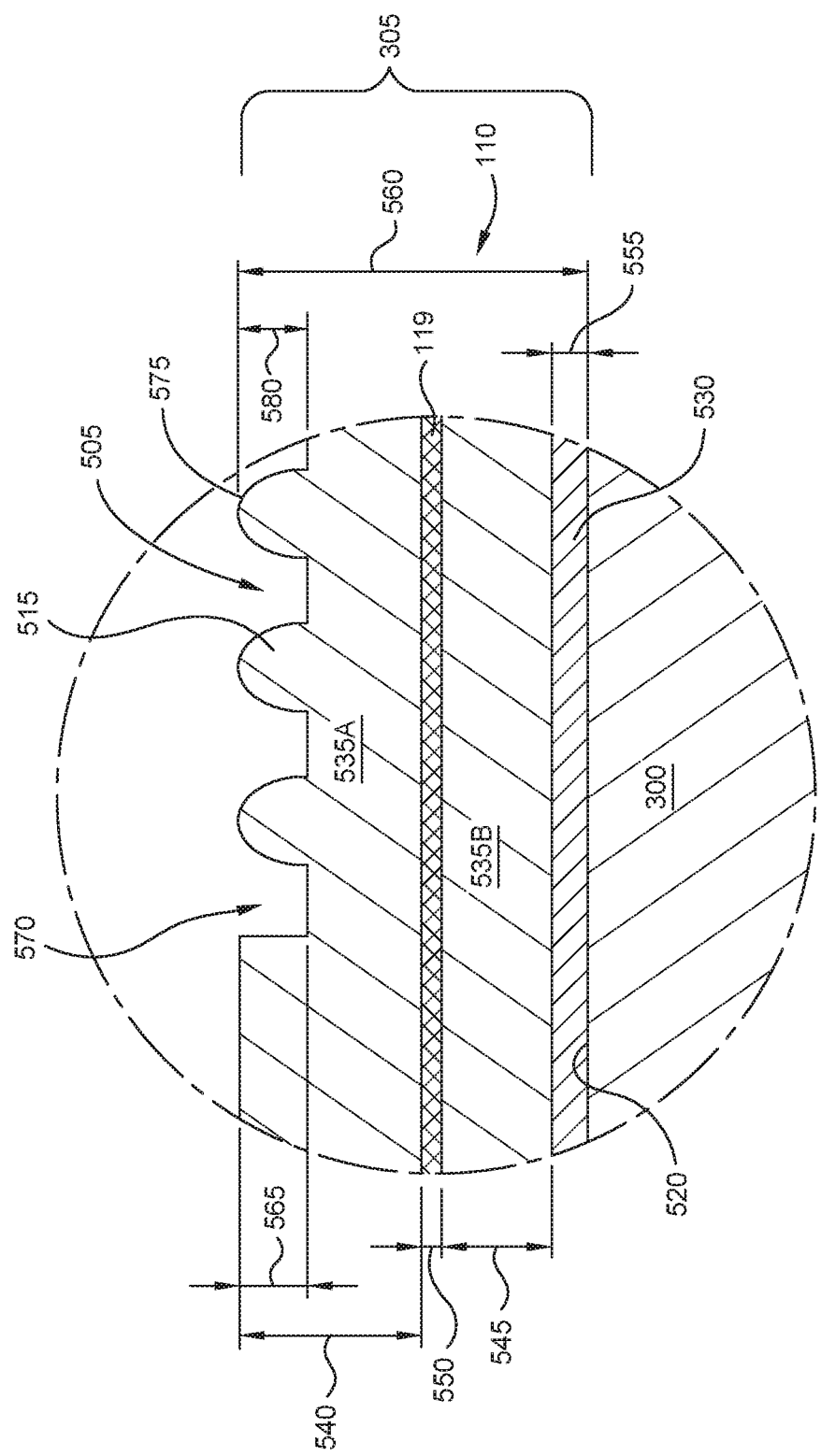
FIG. 5B is an enlarged view of the substrate support of FIG. 5A.

FIG. 5A is a sectional side view of a portion of the substrate support 110 according to another implementation. FIG. 5B is an enlarged view of the substrate support 110 of FIG. 5A.

In FIG. 5A, an edge 500 of the substrate receiving surface 112 of the substrate support 110 is shown. A portion of the plurality of grooves 115 are shown on the substrate receiving surface 112 of the substrate support 110. The edge 500 is similar about the entire perimeter of the substrate receiving surface 112 of the substrate support 110. Similarly, a grooved surface 505 formed by the plurality of grooves 115 is substantially constant across the entire substrate receiving surface 112 of the substrate support 110 inward of the edge 500.

The edge 500 includes a rounded corner 510. The rounded corner 510 interfaces between the recessed surface 202 and the substrate receiving surface 112 of the substrate support 110. A dielectric layer 515 is disposed over an upper surface 520 of the body 300 of the substrate support 110. The dielectric layer 515 includes the electrostatic chuck 305 adjacent to the substrate receiving surface 112 of the substrate support 110. The dielectric layer 515 also extends about and covers the edge 500. The dielectric layer 515 also covers a sidewall 525 of the substrate support 110. A plane of the sidewall 525 is generally orthogonal to a plane of the upper surface 520. The dielectric layer 515 generally electrically insulates the body 300 from the mask 108 (not shown in FIG. 5A.

In FIG. 5B, the electrostatic chuck 305 is shown on the upper surface 520 of the body 300 of the substrate support 110. An interface layer 530 is shown between the upper surface 520 of the body 300 and the dielectric layer 515 of the electrostatic chuck 305. The interface layer 530 may include one or more layers of dielectric and/or thermally insulating films. The interface layer 530 may also be an anodized layer having a roughened surface(s) to promote adhesion between the upper surface 520 of the body 300 of the substrate support 110 and the dielectric layer 515.

The dielectric layer 515 comprises a ceramic material, such as aluminum oxide ($Al_2O_3$). The dielectric layer 515 consists of a first portion 535A and a second portion 535B. The first portion 535A is positioned above the electrode 119 and the second portion 535B is positioned below the electrode 119. The second portion 535B is also sandwiched between the interface layer 530 and the electrode 119.

The first portion 535A and the second portion 535B have a first thickness 540 and a second thickness 545. The first thickness 540 is substantially equal to the second thickness 545 in some embodiments. The first thickness 540 is about 0.2 millimeters (mm) to about 0.4 mm, such as about 0.3 mm in some embodiments. A thickness of the electrode 119 is about 0.04 mm to about 0.06 mm, such as about 0.05 mm. A thickness 555 of the interface layer 530 is about 0.08 mm to about 0.013 mm, such as about 0.1 mm. A thickness 560 of the electrostatic chuck 305 and the interface layer 530 may be about 0.7 mm to about 0.8 mm.

The grooved surface 505 includes the plurality of grooves 115 as well as a plurality of protrusions 575 formed adjacent to the grooves 115. A depth 565 of an outermost groove 570 of the plurality of grooves 115 is about 0.04 mm to about 0.06 mm. A height 580 of the protrusions 575 is about 0.02 mm to about 0.04 mm.

Figure 6:
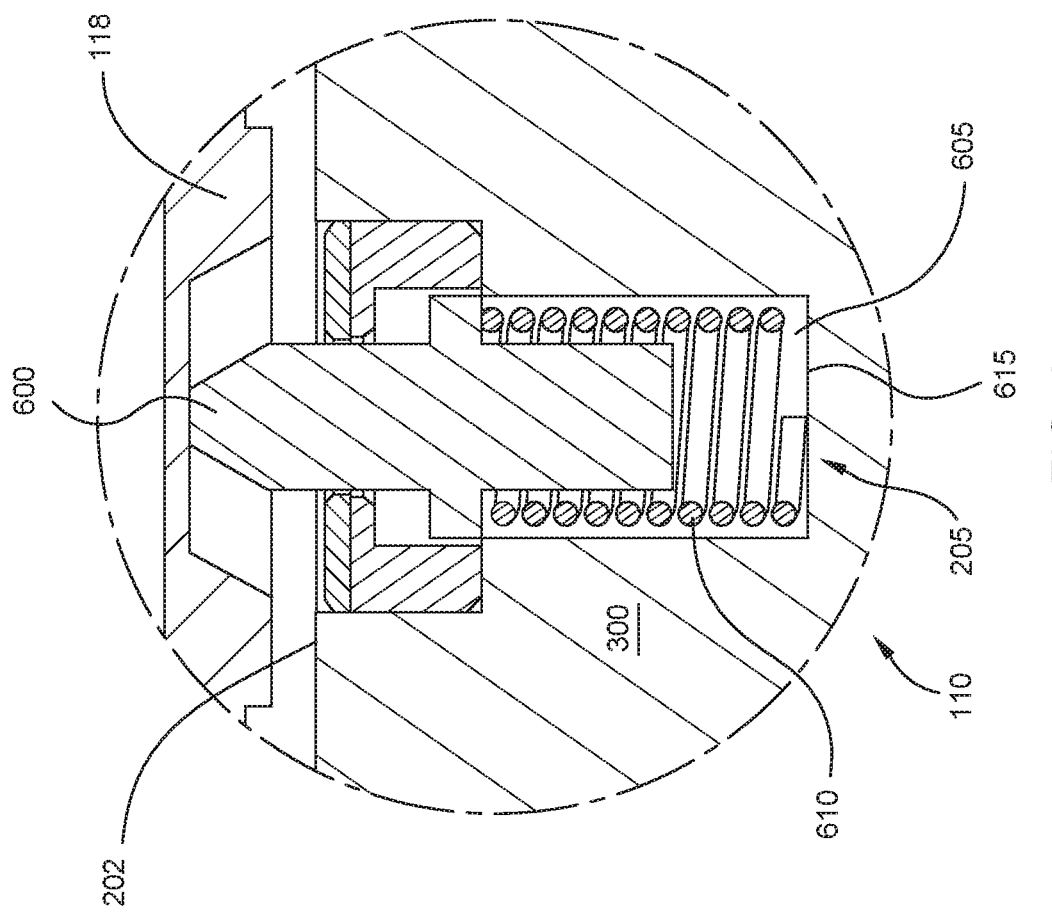
FIG. 6 is a sectional view of a portion of the body of the substrate support and the mask frame showing one embodiment of a compressible button.

FIG. 6 is a sectional view of a portion of the body 300 of the substrate support 110 and the mask frame 118 showing one embodiment of a compressible button 205. The compressible button 205 includes a contact pin 600 that is movably disposed in a blind hole 605 formed in the recessed surface 202 of the substrate support 110. An elastic member 610, such as compression spring, is at least partially disposed in the blind hole 605. The elastic member 610 is utilized to bias the contact pin 600 toward the mask frame 118. The elastic member 610 allows the contact pin 600 to move toward a bottom surface 615 of the blind hole 605 based on movement of the mask frame 118 while maintaining contact with the mask frame 118. The materials of the contact pin 600 and/or the elastic member 610 may be made based on the need for electrical continuity or electrical insulation between the contact pin 600 and the mask 108.

While the foregoing is directed to embodiments of the disclosure, other and further embodiments of the disclosure may be devised without departing from the basic scope thereof, and the scope thereof is determined by the claims that follow.

The invention claimed is:
1. A substrate support, comprising:
  a substrate receiving surface;
  a recessed portion disposed about a periphery of the substrate receiving surface, the recessed portion configured for receipt of a shadow frame;
  an electrostatic chuck disposed below the substrate receiving surface; and
  a plurality of compressible buttons, each compressible button disposed within a respective opening formed in the recessed portion and forming an electrical circuit with the electrostatic chuck.
2. The substrate support of claim 1, wherein the electrostatic chuck comprises a dielectric layer adhered to an upper surface of a body of the substrate support.
3. The substrate support of claim 2, wherein the dielectric layer comprises a ceramic material.
4. The substrate support of claim 2, wherein an electrode is embedded in the dielectric layer.
5. The substrate support of claim 2, wherein the dielectric layer is embossed to form a groove pattern on the substrate receiving surface.
6. The substrate support of claim 1, wherein the substrate receiving surface comprises a groove pattern.
7. The substrate support of claim 1, wherein the substrate receiving surface comprises a dielectric layer.
8. The substrate support of claim 7, wherein the dielectric layer extends outside of the substrate receiving surface.
9. The substrate support of claim 7, wherein a body of the substrate support includes a sidewall, and the dielectric layer covers a portion of the sidewall.
10. A substrate support, comprising:
  a body comprising a conductive material;
  a substrate receiving surface comprising a dielectric layer adhered to the body, wherein the body includes a recessed portion disposed about a periphery of the substrate receiving surface;
  a pocket in the recessed portion, the pocket configured for receipt of a mask frame;
  an electrostatic chuck disposed below the substrate receiving surface; and a plurality of compressible buttons, each compressible button disposed within a respective opening formed in the pocket and forming an electrical circuit with the electrostatic chuck.

11. The substrate support of claim 10, wherein each of the compressible buttons are made of an electrically conductive material.

12. The substrate support of claim 10, wherein each of the compressible buttons are made of dielectric material.

13. The substrate support of claim 10, wherein the dielectric layer comprises a ceramic material.

14. The substrate support of claim 13, wherein an electrode is embedded in the dielectric layer.

15. The substrate support of claim 13, wherein the dielectric layer is embossed to form a groove pattern on the substrate receiving surface.

16. A substrate support, comprising:
a body comprising a conductive material;
a substrate receiving surface comprising a dielectric layer adhered to the body, wherein the body includes a recessed portion disposed about a periphery of the substrate receiving surface, and the substrate receiving surface comprises a groove pattern;
an electrostatic chuck disposed in the dielectric layer below the substrate receiving surface; and
a plurality of compressible buttons, each compressible button disposed about a periphery of the electrostatic chuck within a respective opening formed in the recessed portion and forming an electrical circuit with the electrostatic chuck.

17. The substrate support of claim 16, wherein each of the compressible buttons are made of an electrically conductive material.

18. The substrate support of claim 16, wherein each of the compressible buttons are made of dielectric material.

19. The substrate support of claim 16, wherein the dielectric layer comprises a ceramic material.

20. The substrate support of claim 19, wherein an electrode is embedded in the dielectric layer.

* * * * *